US012801802B2

(12) United States Patent
Gu et al.

(10) Patent No.: US 12,801,802 B2
(45) Date of Patent: Nov. 17, 2026

(54) NUMERICAL PARITY FOR MULTI-PLATFORM

(71) Applicant: GM Cruise Holdings LLC, San Francisco, CA (US)

(72) Inventors: Yongfeng Gu, Chestnut Hill, MA (US); Robert Silvernagel, Gig Harbor, WA (US); Brent Valle, Livermore, CA (US); Carrell Daniel Killebrew, Holly Springs, NC (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 697 days.

(21) Appl. No.: 18/468,280

(22) Filed: Sep. 15, 2023

(65) Prior Publication Data

US 2025/0094658 A1 Mar. 20, 2025

(51) Int. Cl.
*G06F 30/00* (2020.01)
*G06F 30/15* (2020.01)
*G06F 30/27* (2020.01)

(52) U.S. Cl.
CPC .............. *G06F 30/15* (2020.01); *G06F 30/27* (2020.01)

(58) Field of Classification Search
CPC ........................................................ G06F 30/00
See application file for complete search history.

(56) References Cited

U.S. PATENT DOCUMENTS

2023/0080379 A1* 3/2023 Rider ........................ B64F 5/00 706/12
2023/0303052 A1* 9/2023 Gesang .................... B60K 6/26

* cited by examiner

*Primary Examiner* — Maryam A Nasri
(74) *Attorney, Agent, or Firm* — CANTOR COLBURN LLP

(57) ABSTRACT

The present disclosure generally relates to improving the accuracy of autonomous vehicle simulations by identifying which test results are most dependent on a hardware type and/or software version used in the computing systems of the simulation and the AV. In some aspects, a method of the disclosed technology includes steps for performing a test on a first hardware component type associated with an AV to produce a first output; performing the test on a second hardware component type associated with a simulation of an AV to produce a second output; comparing the first output with the second output using a statistical analysis to determine a value related to a difference between the first output and the second output; and assigning a weight to the test based on the value related to the difference between the first output and the second output. Systems and machine-readable media are also provided.

20 Claims, 6 Drawing Sheets

NUMERICAL PARITY FOR MULTI-PLATFORM

BACKGROUND

1. Technical Field

The present disclosure generally relates to improving the accuracy of autonomous vehicle simulations by identifying which test results are most dependent on a hardware type and/or software version, and more specifically, improving the accuracy of autonomous vehicle simulations by identifying which test results are most dependent on the type of hardware and/or version of software used in the computing systems of the simulation and the AV, and subsequently removing (or giving less weight) to those tests whose results are most divergent between simulation and real-world AV due to the different type of hardware or version of software used.

2. Introduction

An autonomous vehicle is a motorized vehicle that can navigate without a human driver. An exemplary autonomous vehicle can include various sensors, such as a camera sensor, a light detection and ranging (LIDAR) sensor, and a radio detection and ranging (RADAR) sensor, amongst others. The sensors collect data and measurements that the autonomous vehicle can use for operations such as navigation. The sensors can provide the data and measurements to an internal computing system of the autonomous vehicle, which can use the data and measurements to control a mechanical system of the autonomous vehicle, such as a vehicle propulsion system, a braking system, or a steering system. Typically, the sensors are mounted at fixed locations on the autonomous vehicles.

BRIEF DESCRIPTION OF THE DRAWINGS

The various advantages and features of the present technology will become apparent by reference to specific implementations illustrated in the appended drawings. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which.

DETAILED DESCRIPTION

Figure 1:
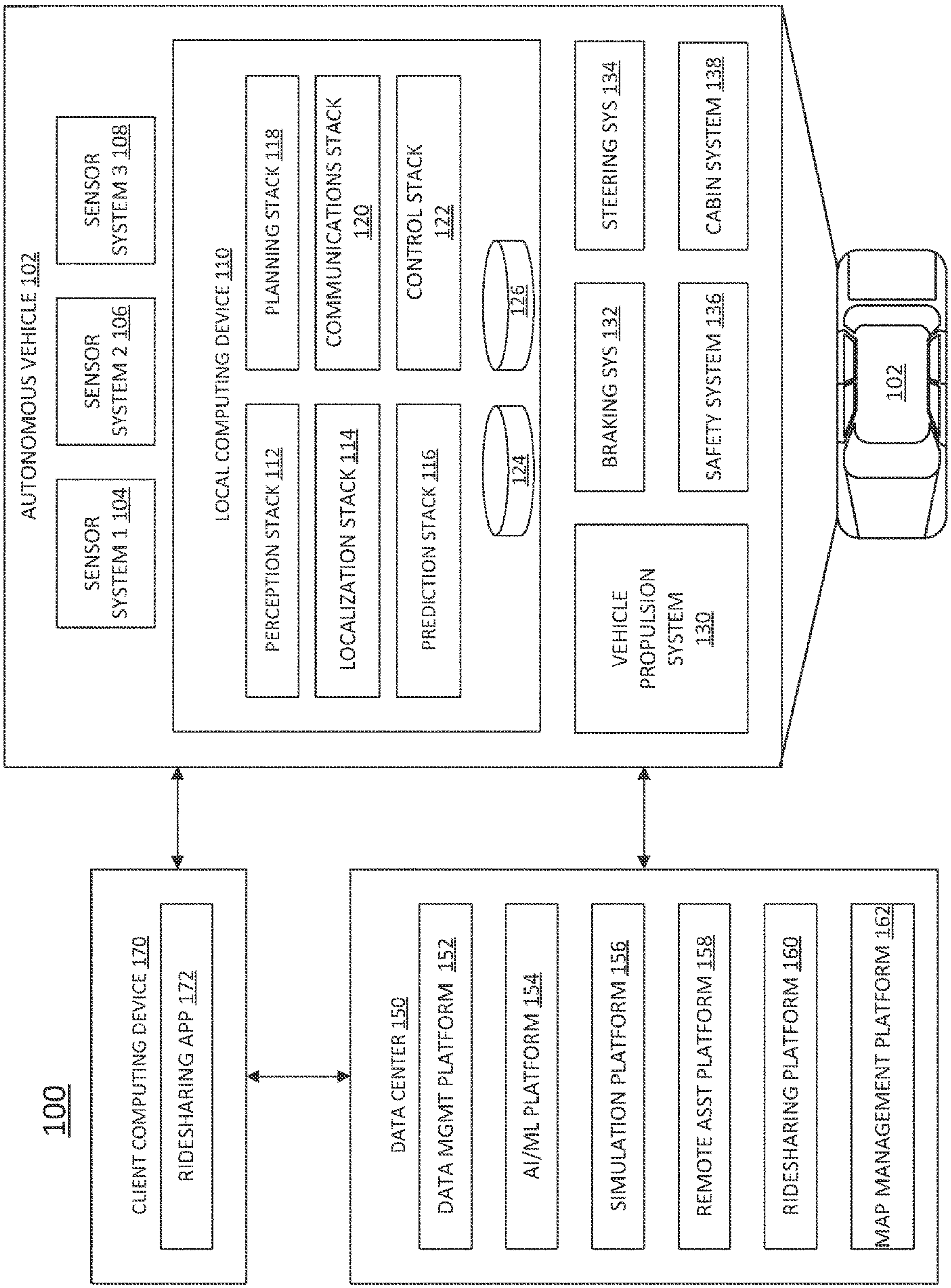
FIG. 1 illustrates an example system environment that can be used to facilitate autonomous vehicle (AV) dispatch and operations, according to some aspects of the disclosed technology.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form to avoid obscuring the concepts of the subject technology.

Some aspects of the present technology may relate to the gathering and use of data available from various sources to improve safety, quality, and experience. The present disclosure contemplates that in some instances, this gathered data may include personal information. The present disclosure contemplates that the entities involved with such personal information respect and value privacy policies and practices.

An autonomous vehicle (AV) is a motorized vehicle that can navigate roadways without a human driver. An exemplary AV can include various sensors, such as a camera sensor, a light detection and ranging (LIDAR) sensor, a radio detection and ranging (RADAR) sensor, an inertial measurement unit (IMU), and/or an acoustic sensor (e.g., sound navigation and ranging (SONAR), microphone, etc.), global navigation satellite system (GNSS) and/or global positioning system (GPS) receiver, amongst others. The AV can use these various sensors to collect data and measurements that the AV can use for AV operations such as perception (e.g., object detection, event detection, tracking, localization, sensor fusion, point cloud processing, image processing, etc.), planning (e.g., route planning, trajectory planning, situation analysis, behavioral and/or action planning, mission planning, etc.), control (e.g., steering, braking, throttling, lateral control, longitudinal control, model predictive control (MPC), proportional-derivative-integral, etc.), prediction (e.g., motion prediction, behavior prediction, etc.), etc. The sensors can provide the data and measurements to an internal computing system of the AV, which can use the data and measurements to control a mechanical system of the AV, such as a vehicle propulsion system, a braking system, and/or a steering system, for example. Data and measurements can also be provided to a cloud computing system to run one or more simulations to test the behavior of a simulated AV. In some examples, the internal computing system and the cloud computing system can include one or more graphical processing units (GPUs), digital signal processors, application-specific integrated circuits (ASICs), and various accelerators for performing the simulations and/or controlling the mechanical system of the AV.

Simulations may also be used, for example, to test one or more changes/updates of the code of an AV software, test how an AV implementing the AV software performs in a test scenario (e.g., an environment, a testing condition(s), etc.) reproduced in the simulation, test and validate the AV software (and/or a change(s) to the code of the AV software) before the AV software is transferred to an AV (e.g., before the AV software is released to an AV and used by the AV in real-world scenarios), test one or more aspects of the AV software such as, for example, one or more capabilities, operations, and/or behaviors performed and/or controlled/influenced by the AV software, etc., and/or update a machine learning model. In some examples, the simulation can be used to test one or more AV software stacks (and/or code and/or aspects thereof) such as, for example and without limitation, a perception stack, a planning stack, a prediction stack, a control stack, a localization stack, and/or any other AV software stack(s). Simulations, however, may reveal divergences between AV behavior in the real-world and the behavior of the simulated AV in the simulation. In some scenarios, such divergences may be caused by the simulation computing system using different software versions or hardware types (for example, different GPU types) than the AV internal computing system. For example, simulations can be run on a cloud network that uses a GPU type that is less expensive and/or more available than the type of GPU used in the AV internal computing system.

Described herein are systems, apparatuses, processes (also referred to as methods), and computer-readable media (collectively referred to as "systems and techniques") for improving the accuracy of simulations by identifying which test results are most dependent on software versions or hardware types (such as, for example GPU types) used in the computing systems of the simulation and the AV, and subsequently removing (or giving less weight) to those tests whose results are most divergent between simulation and real-world AV results due to the software versions or hardware types employed. This process can ensure that the test results are accurate and trustworthy, as well as representative of how the AV behaves in the real world. One problem encountered when trying to identify when the test results from the simulation diverge from the test results from the real-world AV behavior is the inherent nondeterminism of the results obtained during simulations.

In some examples, divergences between a simulation and a corresponding real-world environment can be based on differences in object and/or feature placement, and/or other differences in object characteristics. For example, real-world objects represented in road data may be incorrectly rendered and/or incorrectly placed in the simulated environment such that they have different appearance, location, and/or pose characteristics in the simulation environment as compared to the real-world. In some instances, divergences between a simulation and corresponding real-world environment can be based on differences in how AV behaviors and/or AV systems are modeled in simulation as compared to the performance of analogous behaviors/systems in the real-world. For example, physical AV sensors (e.g., LiDAR, camera and/or RADAR sensors etc.) used to collect real-world road data may be inaccurately (or incompletely) emulated in the simulation environment, resulting in differences in how objects are perceived in the simulation environment as compared to the real-world. Similarly, compute characteristics of a virtual (simulated) AV operating in the SIM environment may be modeled in a manner that deviates from how compute resources (e.g., compute nodes, compute graphs, etc.) perform on physical AVs navigating the real-world environment.

Therefore, rather than directly comparing the results of the tests between the simulation and the real-world, a statistical analysis can be employed to determine whether the results from the simulation diverge from the results of the real-world AV above a predefined threshold, and if so, a weight can be assigned to the specific test to give it less significance (or the test can be removed all together). In some cases, this statistical analysis can be performed using machine learning networks.

FIG. 1 is a diagram illustrating an example autonomous vehicle (AV) environment 100, according to some examples of the present disclosure. One of ordinary skill in the art will understand that, for AV environment 100 and any system discussed in the present disclosure, there can be additional or fewer components in similar or alternative configurations. The illustrations and examples provided in the present disclosure are for conciseness and clarity. Other examples may include different numbers and/or types of elements, but one of ordinary skill the art will appreciate that such variations do not depart from the scope of the present disclosure.

In this example, the AV environment 100 includes an AV 102, a data center 150, and a client computing device 170. The AV 102, the data center 150, and the client computing device 170 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

The AV 102 can navigate roadways without a human driver based on sensor signals generated by multiple sensor systems 104, 106, and 108. The sensor systems 104-108 can include one or more types of sensors and can be arranged about the AV 102. For instance, the sensor systems 104-108 can include Inertial Measurement Units (IMUs), cameras (e.g., still image cameras, video cameras, etc.), light sensors (e.g., LIDAR systems, ambient light sensors, infrared sensors, etc.), RADAR systems, GPS receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 104 can be a camera system, the sensor system 106 can be a LIDAR system, and the sensor system 108 can be a RADAR system. Other examples may include any other number and type of sensors.

The AV 102 can also include several mechanical systems that can be used to maneuver or operate the AV 102. For instance, the mechanical systems can include a vehicle propulsion system 130, a braking system 132, a steering system 134, a safety system 136, and a cabin system 138, among other systems. The vehicle propulsion system 130 can include an electric motor, an internal combustion engine, or both. The braking system 132 can include an engine brake, brake pads, actuators, and/or any other suitable componentry configured to assist in decelerating the AV 102. The steering system 134 can include suitable componentry configured to control the direction of movement of the AV 102 during navigation. The safety system 136 can include lights and signal indicators, a parking brake, airbags, and so forth. The cabin system 138 can include cabin temperature control systems, in-cabin entertainment systems, and so forth. In some examples, the AV 102 might not include human driver actuators (e.g., steering wheel, handbrake, foot brake pedal, foot accelerator pedal, turn signal lever, window wipers, etc.) for controlling the AV 102. Instead, the cabin system 138 can include one or more client interfaces (e.g., Graphical User Interfaces (GUIs), Voice User Interfaces (VUIs), etc.) for controlling certain aspects of the mechanical systems 130-138.

The AV 102 can include a local computing device 110 that is in communication with the sensor systems 104-108, the mechanical systems 130-138, the data center 150, and the client computing device 170, among other systems. The local computing device 110 can include one or more processors and memory, including instructions that can be executed by the one or more processors. The instructions can make up one or more software stacks or components responsible for controlling the AV 102; communicating with the data center 150, the client computing device 170, and other systems; receiving inputs from riders, passengers, and other entities within the AV's environment; logging metrics collected by the sensor systems 104-108; and so forth. In this example, the local computing device 110 includes a perception stack 112, a localization stack 114, a prediction stack 116, a planning stack 118, a communications stack 120, a control stack 122, an AV operational database 124, and an HD geospatial database 126, among other stacks and systems.

Perception stack 112 can enable the AV 102 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 104-108, the localization stack 114, the HD geospatial database 126, other components of the AV, and other data sources (e.g., the data center 150, the client computing device 170, third party data sources, etc.). The perception stack 112 can detect and classify objects and determine their current locations, speeds, directions, and the like. In addition, the perception stack 112 can determine the free space around the AV 102 (e.g., to maintain a safe distance from other objects, change lanes, park the AV, etc.). The perception stack 112 can identify environmental uncertainties, such as where to look for moving objects, flag areas that may be obscured or blocked from view, and so forth. In some examples, an output of the perception stack 112 can be a bounding area around a perceived object that can be associated with a semantic label that identifies the type of object that is within the bounding area, the kinematic of the object (information about its movement), a tracked path of the object, and a description of the pose of the object (its orientation or heading, etc.).

Localization stack 114 can determine the AV's position and orientation (pose) using different methods from multiple systems (e.g., GPS, IMUs, cameras, LIDAR, RADAR, ultrasonic sensors, the HD geospatial database 126, etc.). For example, in some cases, the AV 102 can compare sensor data captured in real-time by the sensor systems 104-108 to data in the HD geospatial database 126 to determine its precise (e.g., accurate to the order of a few centimeters or less) position and orientation. The AV 102 can focus its search based on sensor data from one or more first sensor systems (e.g., GPS) by matching sensor data from one or more second sensor systems (e.g., LIDAR). If the mapping and localization information from one system is unavailable, the AV 102 can use mapping and localization information from a redundant system and/or from remote data sources.

Prediction stack 116 can receive information from the localization stack 114 and objects identified by the perception stack 112 and predict a future path for the objects. In some examples, the prediction stack 116 can output several likely paths that an object is predicted to take along with a probability associated with each path. For each predicted path, the prediction stack 116 can also output a range of points along the path corresponding to a predicted location of the object along the path at future time intervals along with an expected error value for each of the points that indicates a probabilistic deviation from that point.

Planning stack 118 can determine how to maneuver or operate the AV 102 safely and efficiently in its environment. For example, the planning stack 118 can receive the location, speed, and direction of the AV 102, geospatial data, data regarding objects sharing the road with the AV 102 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 102 from one point to another and outputs from the perception stack 112, localization stack 114, and prediction stack 116. The planning stack 118 can determine multiple sets of one or more mechanical operations that the AV 102 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 118 can select from multiple backup plans to carry out. For example, while preparing to change lanes to turn right at an intersection, another vehicle may aggressively cut into the destination lane, making the lane change unsafe. The planning stack 118 could have already determined an alternative plan for such an event. Upon its occurrence, it could help direct the AV 102 to go around the block instead of blocking a current lane while waiting for an opening to change lanes.

Control stack 122 can manage the operation of the vehicle propulsion system 130, the braking system 132, the steering system 134, the safety system 136, and the cabin system 138. The control stack 122 can receive sensor signals from the sensor systems 104-108 as well as communicate with other stacks or components of the local computing device 110 or a remote system (e.g., the data center 150) to effectuate operation of the AV 102. For example, the control stack 122 can implement the final path or actions from the multiple paths or actions provided by the planning stack 118. This can involve turning the routes and decisions from the planning stack 118 into commands for the actuators that control the AV's steering, throttle, brake, and drive unit.

Communications stack 120 can transmit and receive signals between the various stacks and other components of the AV 102 and between the AV 102, the data center 150, the client computing device 170, and other remote systems. The communications stack 120 can enable the local computing device 110 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). Communications stack 120 can also facilitate the local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Low Power Wide Area Network (LPWAN), Bluetooth®, infrared, etc.).

The HD geospatial database 126 can store HD maps and related data of the streets upon which the AV 102 travels. In some examples, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include three-dimensional (3D) attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal u-turn lanes; permissive or protected only right turn lanes; etc.). The traffic controls lane can include geospatial information of traffic signal lights, traffic signs, and other road objects and related attributes.

AV operational database 124 can store raw AV data generated by the sensor systems 104-108, stacks 112-122, and other components of the AV 102 and/or data received by the AV 102 from remote systems (e.g., the data center 150, the client computing device 170, etc.). In some examples, the raw AV data can include HD LIDAR point cloud data, image data, RADAR data, GPS data, and other sensor data that the data center 150 can use for creating or updating AV geospatial data or for creating simulations of situations encountered by AV 102 for future testing or training of various machine learning algorithms that are incorporated in the local computing device 110.

Data center 150 can include a private cloud (e.g., an enterprise network, a co-location provider network, etc.), a public cloud (e.g., an Infrastructure as a Service (IaaS) network, a Platform as a Service (PaaS) network, a Software as a Service (SaaS) network, or other Cloud Service Provider (CSP) network), a hybrid cloud, a multi-cloud, and/or any other network. The data center 150 can include one or more computing devices remote to the local computing device 110 for managing a fleet of AVs and AV-related services. For example, in addition to managing the AV 102, the data center 150 may also support a ride-hailing service (e.g., a ridesharing service), a delivery service, a remote/roadside assistance service, street services (e.g., street mapping, street patrol, street cleaning, street metering, parking reservation, etc.), and the like.

Data center 150 can send and receive various signals to and from the AV 102 and the client computing device 170. These signals can include sensor data captured by the sensor systems 104-108, roadside assistance requests, software updates, ride-hailing/ridesharing pick-up and drop-off instructions, and so forth. In this example, the data center 150 includes a data management platform 152, an Artificial Intelligence/Machine Learning (AI/ML) platform 154, a simulation platform 156, a remote assistance platform 158, and a ride-hailing platform 160, and a map management platform 162, among other systems.

Data management platform 152 can be a "big data" system capable of receiving and transmitting data at high velocities (e.g., near real-time or real-time), processing a large variety of data and storing large volumes of data (e.g., terabytes, petabytes, or more of data). The varieties of data can include data having different structures (e.g., structured, semi-structured, unstructured, etc.), data of different types (e.g., sensor data, mechanical system data, ride-hailing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), and/or data having other characteristics. The various platforms and systems of the data center 150 can access data stored by the data management platform 152 to provide their respective services.

The AI/ML platform 154 can provide the infrastructure for training and evaluating machine learning algorithms for operating the AV 102, the simulation platform 156, the remote assistance platform 158, the ride-hailing platform 160, the map management platform 162, and other platforms and systems. Using the AI/ML platform 154, data scientists can prepare data sets from the data management platform 152; select, design, and train machine learning models; evaluate, refine, and deploy the models; maintain, monitor, and retrain the models; and so on.

Simulation platform 156 can enable testing and validation of the algorithms, machine learning models, neural networks, and other development efforts for the AV 102, the remote assistance platform 158, the ride-hailing platform 160, the map management platform 162, and other platforms and systems. Simulation platform 156 can replicate a variety of driving environments and/or reproduce real-world scenarios from data captured by the AV 102, including rendering geospatial information and road infrastructure (e.g., streets, lanes, crosswalks, traffic lights, stop signs, etc.) obtained from a cartography platform (e.g., map management platform 162); modeling the behavior of other vehicles, bicycles, pedestrians, and other dynamic elements; simulating inclement weather conditions, different traffic scenarios; and so on.

Remote assistance platform 158 can generate and transmit instructions regarding the operation of the AV 102. For example, in response to an output of the AI/ML platform 154 or other system of the data center 150, the remote assistance platform 158 can prepare instructions for one or more stacks or other components of the AV 102.

Ride-hailing platform 160 can interact with a customer of a ride-hailing service via a ride-hailing application 172 executing on the client computing device 170. The client computing device 170 can be any type of computing system such as, for example and without limitation, a server, desktop computer, laptop computer, tablet computer, smartphone, smart wearable device (e.g., smartwatch, smart eyeglasses or other Head-Mounted Display (HMD), smart ear pods, or other smart in-ear, on-ear, or over-ear device, etc.), gaming system, or any other computing device for accessing the ride-hailing application 172. The client computing device 170 can be a customer's mobile computing device or a computing device integrated with the AV 102 (e.g., the local computing device 110). The ride-hailing platform 160 can receive requests to pick up or drop off from the ride-hailing application 172 and dispatch the AV 102 for the trip.

Map management platform 162 can provide a set of tools for the manipulation and management of geographic and spatial (geospatial) and related attribute data. The data management platform 152 can receive LIDAR point cloud data, image data (e.g., still image, video, etc.), RADAR data, GPS data, and other sensor data (e.g., raw data) from one or more AVs 102, Unmanned Aerial Vehicles (UAVs), satellites, third-party mapping services, and other sources of geospatially referenced data. The raw data can be processed, and map management platform 162 can render base representations (e.g., tiles (2D), bounding volumes (3D), etc.) of the AV geospatial data to enable users to view, query, label, edit, and otherwise interact with the data. Map management platform 162 can manage workflows and tasks for operating on the AV geospatial data. Map management platform 162 can control access to the AV geospatial data, including granting or limiting access to the AV geospatial data based on user-based, role-based, group-based, task-based, and other attribute-based access control mechanisms. Map management platform 162 can provide version control for the AV geospatial data, such as to track specific changes that (human or machine) map editors have made to the data and to revert changes when necessary. Map management platform 162 can administer release management of the AV geospatial data, including distributing suitable iterations of the data to different users, computing devices, AVs, and other consumers of HD maps. Map management platform 162 can provide analytics regarding the AV geospatial data and related data, such as to generate insights relating to the throughput and quality of mapping tasks.

In some embodiments, the map viewing services of map management platform 162 can be modularized and deployed as part of one or more of the platforms and systems of the data center 150. For example, the AI/ML platform 154 may incorporate the map viewing services for visualizing the effectiveness of various object detection or object classification models, the simulation platform 156 may incorporate the map viewing services for recreating and visualizing certain driving scenarios, the remote assistance platform 158 may incorporate the map viewing services for replaying traffic incidents to facilitate and coordinate aid, the ride-hailing platform 160 may incorporate the map viewing services into the client application 172 to enable passengers to view the AV 102 in transit en route to a pick-up or drop-off location, and so on.

While the autonomous vehicle 102, the local computing device 110, and the autonomous vehicle environment 100 are shown to include certain systems and components, one of ordinary skill will appreciate that the autonomous vehicle 102, the local computing device 110, and/or the autonomous vehicle environment 100 can include more or fewer systems and/or components than those shown in FIG. 1. For example, the autonomous vehicle 102 can include other services than those shown in FIG. 1 and the local computing device 110 can also include, in some instances, one or more memory devices (e.g., RAM, ROM, cache, and/or the like), one or more network interfaces (e.g., wired and/or wireless communications interfaces and the like), and/or other hardware or processing devices that are not shown in FIG. 1. An illustrative example of a computing device and hardware components that can be implemented with the local computing device 110 is described below with respect to FIG. 6.

Figure 2:
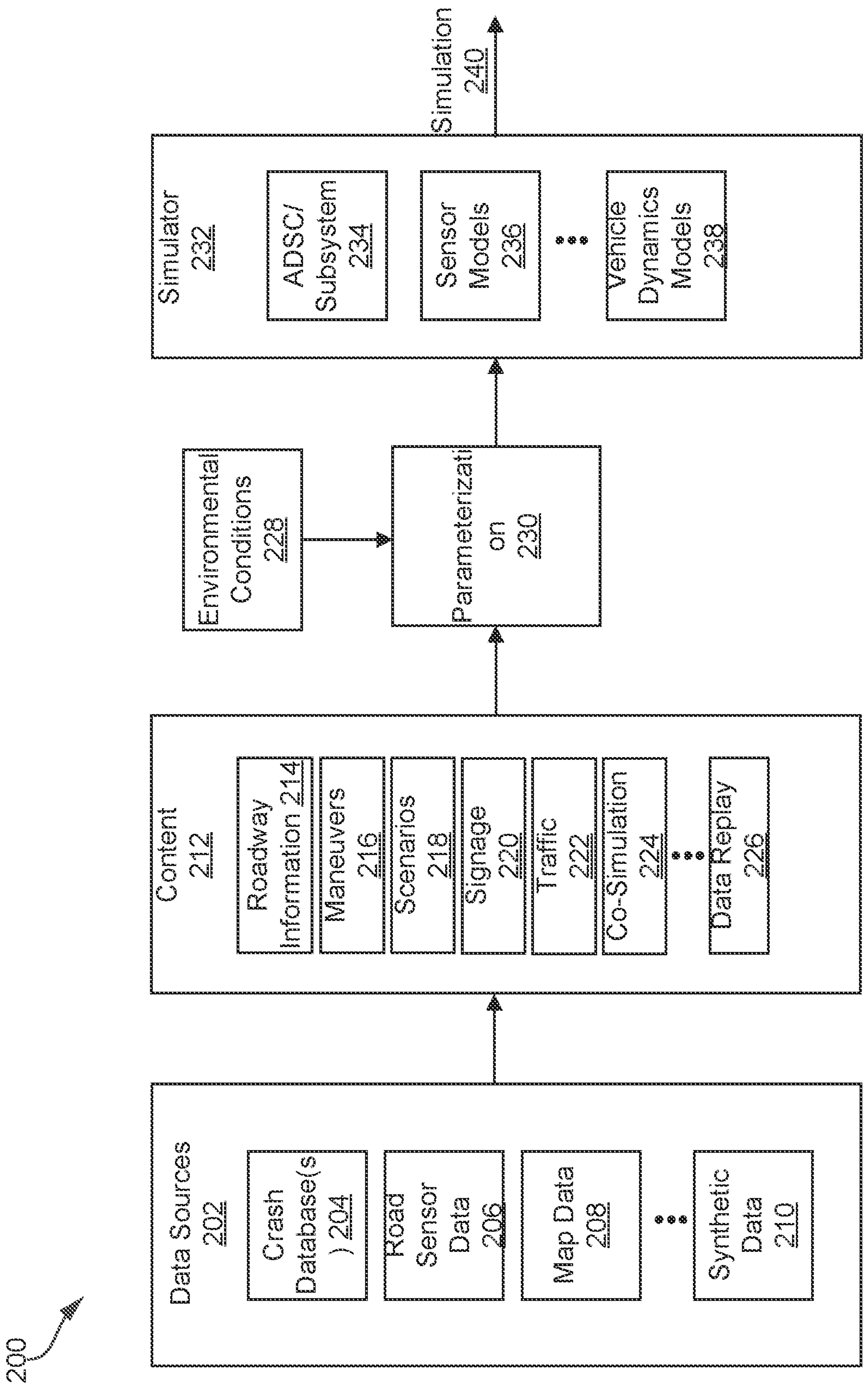
FIG. 2 illustrates an example simulation framework, according to some aspects of the disclosed technology.

FIG. 2 is a diagram illustrating an example simulation framework 200, according to some examples of the present disclosure. The example simulation framework 200 can include data sources 202, content 212, environmental conditions 228, parameterization 230, and simulator 232. The components in the example simulation framework 200 are merely illustrative examples provided for explanation purposes. In other examples, simulation framework 200 can include other components not shown in FIG. 2 and/or more or less components than shown in FIG. 2.

Data sources 202 can be used to create a simulation. The data sources 202 can include, for example and without limitation, one or more crash databases 204, road sensor data 206, map data 208, and/or synthetic data 210. In other examples, the data sources 202 can include more or less sources than shown in FIG. 2 and/or one or more data sources that are not shown in FIG. 2.

Crash databases 204 can include crash data (e.g., data describing crashes and/or associated details) generated by vehicles involved in crashes. The road sensor data 206 can include data collected by one or more sensors (e.g., one or more camera sensors, LIDAR sensors, RADAR sensors, SONAR sensors, IMU sensors, GPS/GNSS receivers, and/or any other sensors) of one or more vehicles while the one or more vehicles drive/navigate one or more real-world environments. The map data 208 can include one or more maps (and, in some cases, associated data) such as, for example and without limitation, one or more high-definition (HD) maps, sensor maps, scene maps, and/or any other maps. In some examples, the one or more HD maps can include roadway information such as, for example, lane widths, location of road signs and traffic lights, directions of travel for each lane, road junction information, speed limit information, etc.

Synthetic data 210 can include virtual assets, objects, and/or elements created for a simulated scene, a virtual scene and/or virtual scene elements, and/or any other synthetic data elements. For example, in some cases, the synthetic data 210 can include one or more virtual vehicles, virtual pedestrians, virtual roads, virtual objects, virtual environments/scenes, virtual signs, virtual backgrounds, virtual buildings, virtual trees, virtual motorcycles/bicycles, virtual obstacles, virtual environmental elements (e.g., weather, lightening, shadows, etc.), virtual surfaces, etc.

In some examples, data from some or all of data sources 202 can be used to create content 212. Content 212 can include static content and/or dynamic content. For example, the content 212 can include roadway information 214, maneuvers 216, scenarios 218, signage 220, traffic 222, co-simulation 224, and/or data replay 226. The roadway information 214 can include, for example, lane information (e.g., number of lanes, lane widths, directions of travel for each lane, etc.), the location and information of road signs and/or traffic lights, road junction information, speed limit information, road attributes (e.g., surfaces, angles of inclination, curvatures, obstacles, etc.), road topologies, and/or other roadway information. The maneuvers 216 can include any AV maneuvers, and the scenarios 218 can include specific AV behaviors in certain AV scenes/environments. Signage 220 can include signs such as, for example, traffic lights, road signs, billboards, displayed messages on the road, etc. The traffic 222 can include any traffic information such as, for example, traffic density, traffic fluctuations, traffic patterns, traffic activity, delays, positions of traffic, velocities, volumes of vehicles in traffic, geometries or footprints of vehicles, pedestrians, spaces (occupied and/or unoccupied), etc.

The co-simulation 224 can include a distributed modeling and simulation of different AV subsystems that form the larger AV system. In some cases, the co-simulation 224 can include information for connecting separate simulations together with interactive communications. In some cases, the co-simulation 224 can allow for modeling to be done at a subsystem level while providing interfaces to connect the subsystems to the rest of the system (e.g., the autonomous driving system computer). Moreover, the data replay 226 can include replay content produced from real-world sensor data (e.g., road sensor data 206).

Environmental conditions 228 can include any information about environmental conditions 228. For example, the environmental conditions 228 can include atmospheric conditions, road/terrain conditions (e.g., surface slope or gradient, surface geometry, surface coefficient of friction, road obstacles, etc.), illumination, weather, road and/or scene conditions resulting from one or more environmental conditions, etc.

Content 212 and the environmental conditions 228 can be used to create the parameterization 230. The parameterization 230 can include parameter ranges, parameterized scenarios, probability density functions of one or more parameters, sampled parameter values, parameter spaces to be tested, evaluation windows for evaluating a behavior of an AV in a simulation, scene parameters, content parameters, environmental parameters, etc. The parameterization 230 can be used by a simulator 232 to generate a simulation 240.

Simulator 232 can include a software engine(s), algorithm(s), neural network model(s), and/or software component(s) used to generate simulations, such as simulation 240. In some examples, the simulator 232 can include ADSC/subsystem models 234, sensor models 236, and a vehicle dynamics model 238. The ADSC/subsystem models 234 can include models, descriptors, and/or interfaces for the autonomous driving system computer (ADSC) and/or ADSC subsystems such as, for example, a perception stack (e.g., perception stack 112), a localization stack (e.g., localization stack 114), a prediction stack (e.g., prediction stack 116), a planning stack (e.g., planning stack 118), a communications stack (e.g., communications stack 120), a control stack (e.g., control stack 122), a sensor system(s), and/or any other subsystems.

Sensor models 236 can include mathematical representations of hardware sensors and an operation (e.g., sensor data processing) of one or more sensors (e.g., a LIDAR, a RADAR, a SONAR, a camera sensor, an IMU, and/or any other sensor). The vehicle dynamics model 238 can model vehicle behaviors/operations, vehicle attributes, vehicle trajectories, vehicle positions, etc.

Figure 3:
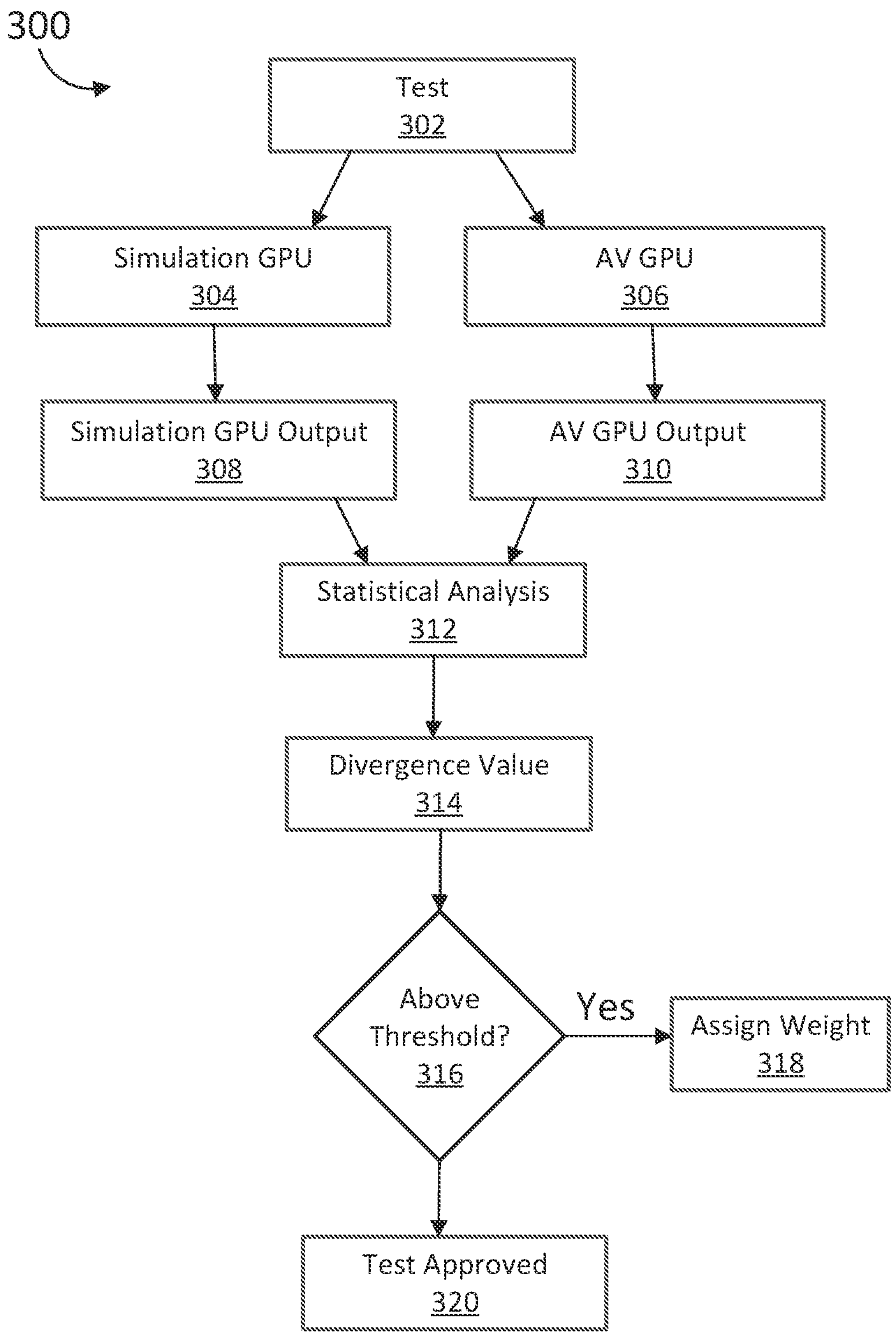
FIG. 3 illustrates a flow diagram of an example process for improving the accuracy of simulations, according to some examples of the present disclosure.

FIG. 3 illustrates a flow diagram of an example process 300 for improving the accuracy of simulations by identifying which test results are most dependent on the version of software or type of hardware (for example, the type of GPU) used in the computing systems of the simulation and the AV, and subsequently removing (or giving less weight) to those tests whose results are most divergent (i.e. non-deterministic and/or unstable) between simulation and real-world AV results due to the versions of software or types of hardware employed. At block 302, the process 300 can include choosing a test to run on both the simulation GPU and the AV GPU. While FIG. 3 illustrates an example of using different GPUs between simulation and real-world AV, it is understood that the process described herein is applicable to any difference between the software versions and/or hardware types used by the simulation and AV. Additionally, the process can be applied in any no-operation scenario. Some additional examples can include GPU driver upgrades, new simulation capabilities including efficiency improvements, no-op AV code changes, etc.

A test can be any number of scenarios relating to the operation of the AV that are presented to the AV and the simulation. For example, a scenario can include navigating an intersection, or any other scenario related to the operation of the AV. In some examples, the test can comprise a group of multiple tests.

The tests can be run in a controlled environment to assure that most (if not all) conditions are the same between the simulation and the real-world AV with the exception of the different software versions or hardware types (e.g., the simulation GPU and the AV GPU). Performing tests in a controlled environment can help assure that variances in the outputs can be attributed to the different software versions and/or hardware types, rather than other factors that can affect the outputs. In some examples, a controlled environment can be an environment where most (if not all) factors that affect the outputs are the are the same between the simulation environment and the real-world environment. Such factors can include factors internal to the operation of the AV and/or factors associated with the environment around the AV.

At block 304, the process 300 can include running at least one test on a simulation comprising a computing system with a GPU. In some examples, the GPU used to run a cloud simulation can be cheaper and/or more available than the GPU used in the real-world AV. While a more expensive GPU can have more processing power than a cheaper GPU, it can be desirable to use a GPU type that is cheaper as long as the GPU can produce results similar to the results of the GPU employed by the real-world AV. While FIG. 3 illustrates an example of using different GPUs between simulation and real-world AV, it is understood that the process described herein is applicable to any difference between the software versions and/or hardware types used by the simulation and AV.

At block 306, the process 300 can include running the same at least one test on the same GPU type that is used in a real-world AV computing system. In some examples, the at least one test can be run on a simulation of the GPU type used in the real-world AV computing system. In some cases, the tests run on the simulation computing system GPU and the GPU type associated with the real-world AV computing system can be run in a controlled environment to isolate the GPU. In some examples, the GPU used in a real-world AV can be more expensive and/or less available than the GPU used to run a cloud simulation. In some examples, AV safety can be weighed against cost and business concerns to select a GPU type to run in either the simulation or real-world AV environment.

At block 308, the process 300 can include receiving an output from the test that is run on the simulation comprising the computing system with a GPU. The outputs from the tests can be used to extract behavior metrics of the AV's performance overall, as well as the performance of various subsystems that influence the AV's performance. For example, an output of the AV's perception stack during simulation can be a bounding area around a perceived object that can be associated with a semantic label that identifies the type of object that is within the bounding area, the kinematic of the object (information about its movement), a tracked path of the object, and a description of the pose of the object (its orientation or heading, etc.). Further, during simulation, the simulated AV's prediction stack can output several likely paths that an object is predicted to take along with a probability associated with each path. For each predicted path, the prediction stack can also output a range of points along the path corresponding to a predicted location of the object along the path at future time intervals along with an expected error value for each of the points that indicates a probabilistic deviation from that point.

At block 310, the process 300 can include receiving an output from the test that is run on the GPU type associated with the real-world AV computing system with a GPU. In some examples, the output can be from one or more tests run on a simulation of the GPU type used in the real-world AV computing system. The output can provide behavior metrics of the AVs performance in the real-world. Additionally, the output can indicate the behavior of subsystems that influence the behavior of the AV. The outputs from the tests run on the simulation comprising the computing system with a GPU should be substantially similar to the outputs from the tests run on the GPU type associated with the real-world AV, as discussed in further detail below. For example, simulation divergence can result in differences in outputs at different layers of the AV software stack (e.g., the perception layer, prediction layer and/or planning layer), thereby compounding into divergences in resulting AV behaviors (e.g., implemented at the control layer), such as AV trajectory, kinematics and/or pose. As used herein, such differences affecting AV kinematics and/or trajectories are referred to as pose divergence/s or AV pose divergence/s.

At block 312, the process 300 can include comparing the output from block 308 and the output from block 310 to determine divergence between the outputs. Divergence can be determined using an applicable technique. Specifically, divergence between the outputs can be determined using a statistical analysis. In many cases, this comparison is not a simple comparison to determine the difference due to the inherent nondeterminism between the outputs from a simulation and the outputs from a test of the GPU associated with the real-world AV (for example, another simulation). That is, in situations where the same test is run on the same GPU type (under exactly the same conditions) in both a simulation and a real-world scenario, the outputs from the tests will still inherently produce diverging results. For example, in some cases the same test can be run multiple times and each time produce a different result, in what is a result of a nondeterministic nature of running the software stack(s).

Nondeterminism in the outputs can be accounted for in performing the comparison of the output from block 308 and the output from block 310. In order to account for this nondeterminism, the comparison can employ statistical analysis of the output from block 308 and the output from block 310 to quantify the differences in the outputs through a divergence value. For example, "two one-sided t-tests" (TOST) can be employed wherein, for both sides of the TOST, the difference between the two distributions can be compared to a predetermined threshold. Additionally, the average per-scenario difference in simulation error rate can be estimated and a confidence interval of this average can be tested to determine that it is less than a threshold. A divergence value can include an applicable representation for qualifying or quantifying an amount of divergence between outputs. For example, the TOST test can provide a confidence that the two test results come from equivalent distributions within an equivalence bound.

At block 314, the process 300 can include outputting the divergence value. In some examples, the divergence value can be a value that indicates how much the output from the simulation test differs from the output from the real-world AV test based on the statistical analysis that accounts for the inherent nondeterminism in the outputs themselves. In some cases, machine learning models can be used to perform the statistical analysis and determine the divergence value.

At block 316, the process 300 can include analyzing the divergence value to troubleshoot testing. Specifically, the divergence value can be compared to a threshold, e.g. predetermined, to determine whether the outputs obtained from the simulation test and the test of GPU type associated with the real-world AV diverge a certain amount with respect to an acceptable divergence amount. In some cases, this threshold value can be determined using statistical analysis. In some examples, machine-learning models can be used to identify how the GPU type contributes to the resulting divergence between the simulation test outputs and the real-world AV test outputs. In some examples, this can be performed by an attribution tool (or attribution module) that is configured to examine various weights of a machine-learning model that is configured to receive divergence metrics from various components or subsystem (e.g., of a simulation renderer) and to make divergence estimates based on the received divergence metrics. As used herein, divergence metrics for any given component or subsystem can be used to describe or quantify differences between specific environmental characteristics and/or objects of a real-world scenario (e.g., as represented in road data) and the resulting characteristics or objects, as rendered in the simulated environment. The divergence metrics provide an indication as to how well a given component of the AV emulates or renders real-world characteristics represented in road data. That is, the divergence metrics provide a quantitative (or qualitative) indication of an amount divergence between how real-world characteristics (e.g., AV sensor data, object placements, AV compute capabilities, etc.) are represented in road data, and how the corresponding characteristics are rendered by the associated component.

If the divergence value obtained from the statistical analysis is larger than the predetermined threshold value, then at block 318 the process 300 can include assigning a weight value to the test. In some examples, this weight can represent the importance of the outputs of the test in analyzing the overall operations of the AV in both simulation and real-world tests. For example, if the divergence value is large enough, the weight value associated with that test can also be large enough to discount the results of that test. In other examples, a test with a large divergence value can be entirely removed from future test suites. If the divergence value obtained from the statistical analysis is less than the predetermined threshold value, then at block 320 the process 300 can include continuing to include that test in future test suites.

The process 300 can be beneficial in determining optimal test suites that can be run on both simulation GPUs and AV GPUs. A test suite can be a group of tests that together can represent scenarios that the AV can encounter. That is, operators can curate a test suite to include only those tests that are most appropriate. In some examples, a curated test suite can include tests that can be used to detect divergences between the two hardware types (e.g., GPU types) and/or software versions in order to determine discrepancies. Some tests can describe individual scenarios, other tests can include parametric sweeps over key scenario parameters.

Figure 4:
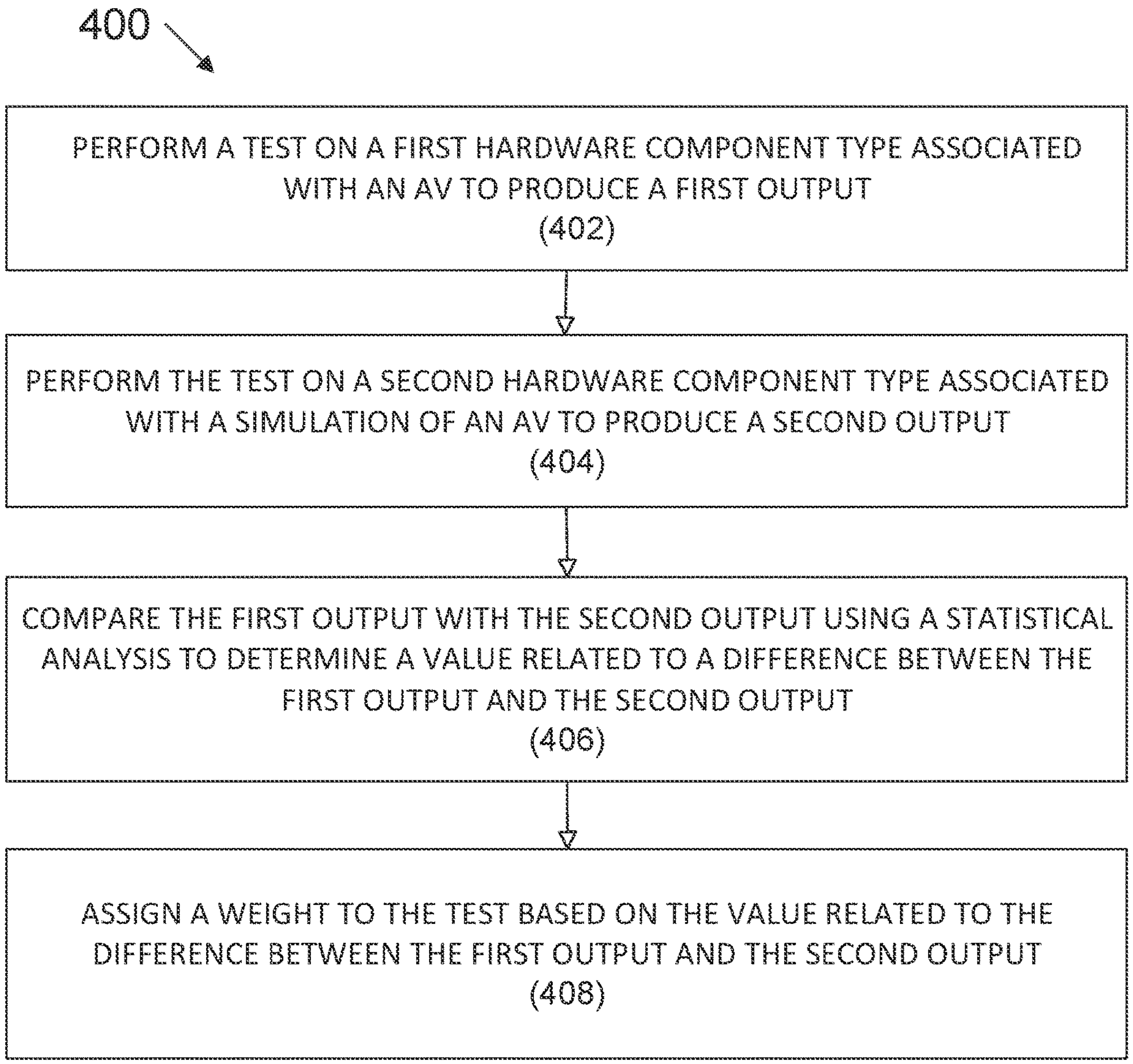
FIG. 4 illustrates a another flow diagram of an example process for improving the accuracy of simulations, according to some examples of the present disclosure.

FIG. 4 illustrates a flow diagram of an example process 400 for improving the accuracy of simulations by identifying which test results are most dependent on the types of GPU used in the computing systems of the simulation and the AV, and subsequently assigning a weight to those tests whose results are most divergent between simulation and real-world AV results due to the types of GPU employed. At block 402, the process 400 can include performing a test on a first hardware component type associated with AV to produce a first output. In some examples, the hardware component type can be a GPU. A test can be any number of scenarios relating to the operation of the AV that are presented to the AV and the simulation. In some examples, the test can comprise a test suite comprising one or more tests. The tests can be run in a controlled environment to normalize conditions other than the different hardware component type (e.g., the simulation hardware type and the AV hardware type). The output of the test can provide behavior metrics of the AVs performance in the real-world. Additionally, the output can indicate the behavior of subsystems that influence the behavior of the AV in the real-world. At block 404, the process 400 can include performing the test on a second hardware component type associated with a simulation of an AV to produce a second output. The test can be the same test (or test suites) performed on the GPU associated with the AV at block 402. For example, the test (or test suites) can be any number of scenarios relating to the operation of the AV that are presented to the AV and the simulation. The output of the test can provide behavior metrics of the AVs performance in simulation. Additionally, the output can indicate the behavior of subsystems that influence the behavior of the AV in simulations.

At block 406, the process 400 can include comparing the first output with the second output using a statistical analysis to determine a value related to a difference between the first output and the second output. One problem encountered when trying to identify when the test results from the simulation diverge from the test results from the real-world AV behavior is the inherent nondeterminism of the results from both the AV stack and the simulation stack. Therefore, rather than directly comparing the results of the tests between the simulation and the real-world, a statistical analysis can be employed to determine whether the results from the simulation diverge from the results of the one or more tests of the GPU type associated with the real-world AV above a predefined threshold. In order to account for the nondeterminism, the statistical analysis of the outputs can quantify the differences in the outputs using a divergence value. In some examples, the divergence value can be a value that indicates how much the output from the simulation test differs from the output from the real-world AV test based on the statistical analysis that accounts for the inherent nondeterminism in the outputs themselves. In some cases, machine learning models can be used to perform the statistical analysis and determine the divergence value.

At block 408, the process 400 can include assigning a weight to the test based on the value related to the difference between the first output and the second output. The statistical analysis can be employed to determine whether the results from the simulation diverge from the results of the real-world AV above a predefined threshold, and if so, a weight can be assigned to the specific test to give it less significance. If the divergence value obtained from the statistical analysis is larger than the predetermined threshold value, then a weight value can be assigned to the test. In some examples, this weight can represent the importance of the outputs of the test in analyzing the overall operations of the AV in both simulation and real-world tests. For example, if the divergence value is large enough, the weight value associated with that test can also be large enough to discount the results of that test. In other examples, a test with a large divergence value can be entirely removed from future test suites. If the divergence value obtained from the statistical analysis is less than the predetermined threshold value, then the test can continue to be included in future test suites.

Figure 5:
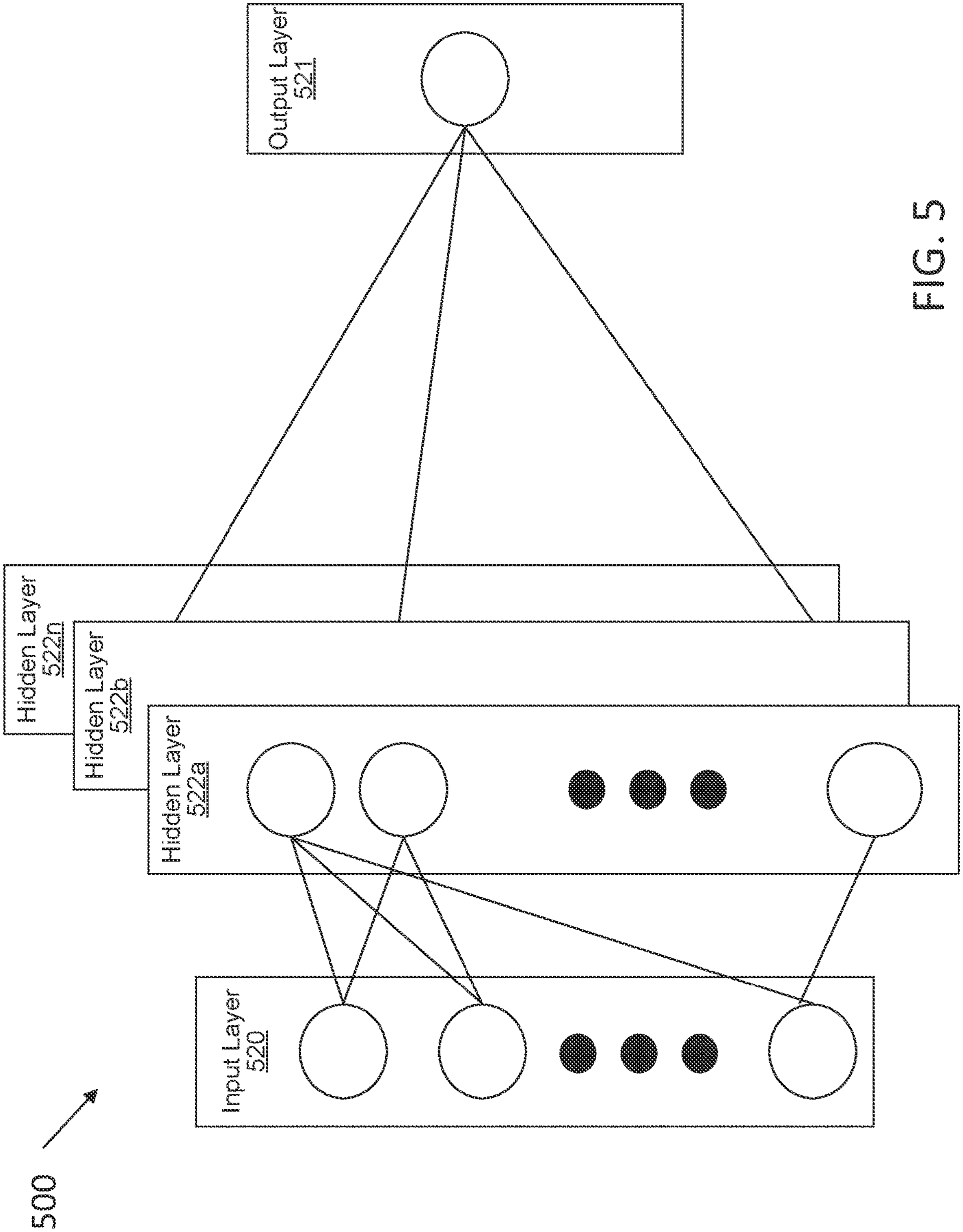
FIG. 5 illustrates an example of a deep learning neural network that can be used to implement a statistical analysis model to determine whether the results from a simulation diverge from the results of a real-world AV, according to some aspects of the disclosed technology.

In FIG. 5, the disclosure now turns to a further discussion of models that can be used through the environments and techniques described herein. FIG. 5 is an example of a deep learning neural network 500 that can be used to implement all or a portion of the systems and techniques described herein (e.g., neural network 500 can be used to implement a statistical analysis model to determine whether the results from a simulation diverge from the results of a real-world AV, as discussed above). An input layer 520 can be configured to receive sensor data and/or data relating to an environment surrounding an AV. Neural network 500 includes multiple hidden layers 522*a*, 522*b*, through 522*n*. The hidden layers 522*a*, 522*b*, through 522*n* include "n" number of hidden layers, where "n" is an integer greater than or equal to one. The number of hidden layers can be made to include as many layers as needed for the given application. Neural network 500 further includes an output layer 521 that provides an output resulting from the processing performed by the hidden layers 522*a*, 522*b*, through 522*n*.

Neural network 500 is a multi-layer neural network of interconnected nodes. Each node can represent a piece of information. Information associated with the nodes is shared among the different layers and each layer retains information as information is processed. In some cases, the neural network 500 can include a feed-forward network, in which case there are no feedback connections where outputs of the network are fed back into itself. In some cases, the neural network 500 can include a recurrent neural network, which can have loops that allow information to be carried across nodes while reading in input.

Information can be exchanged between nodes through node-to-node interconnections between the various layers. Nodes of the input layer 520 can activate a set of nodes in the first hidden layer 522*a*. For example, as shown, each of the input nodes of the input layer 520 is connected to each of the nodes of the first hidden layer 522*a*. The nodes of the first hidden layer 522*a* can transform the information of each input node by applying activation functions to the input node information. The information derived from the transformation can then be passed to and can activate the nodes of the next hidden layer 522*b*, which can perform their own designated functions. Example functions include convolutional, up-sampling, data transformation, and/or any other suitable functions. The output of the hidden layer 522*b* can then activate nodes of the next hidden layer, and so on. The output of the last hidden layer 522*n* can activate one or more nodes of the output layer 521, at which an output is provided. In some cases, while nodes in the neural network 500 are shown as having multiple output lines, a node can have a single output and all lines shown as being output from a node represent the same output value.

In some cases, each node or interconnection between nodes can have a weight that is a set of parameters derived from the training of the neural network 500. Once the neural network 500 is trained, it can be referred to as a trained neural network, which can be used to classify one or more activities. For example, an interconnection between nodes can represent a piece of information learned about the interconnected nodes. The interconnection can have a tunable numeric weight that can be tuned (e.g., based on a training dataset), allowing the neural network 500 to be adaptive to inputs and able to learn as more and more data is processed.

The neural network 500 is pre-trained to process the features from the data in the input layer 520 using the different hidden layers 522*a*, 522*b*, through 522*n* in order to provide the output through the output layer 521.

In some cases, the neural network 500 can adjust the weights of the nodes using a training process called backpropagation. A backpropagation process can include a forward pass, a loss function, a backward pass, and a weight update. The forward pass, loss function, backward pass, and parameter/weight update is performed for one training iteration. The process can be repeated for a certain number of iterations for each set of training data until the neural network 500 is trained well enough so that the weights of the layers are accurately tuned.

To perform training, a loss function can be used to analyze error in the output. Any suitable loss function definition can be used, such as a Cross-Entropy loss. Another example of a loss function includes the mean squared error (MSE), defined as $E\_total = \Sigma(1/2(target-output)^2)$. The loss can be set to be equal to the value of E_total.

The loss (or error) will be high for the initial training data since the actual values will be much different than the predicted output. The goal of training is to minimize the amount of loss so that the predicted output is the same as the training output. The neural network 500 can perform a backward pass by determining which inputs (weights) most contributed to the loss of the network, and can adjust the weights so that the loss decreases and is eventually minimized.

The neural network 500 can include any suitable deep network. One example includes a Convolutional Neural Network (CNN), which includes an input layer and an output layer, with multiple hidden layers between the input and out layers. The hidden layers of a CNN include a series of convolutional, nonlinear, pooling (for downsampling), and fully connected layers. The neural network 500 can include any other deep network other than a CNN, such as an autoencoder, Deep Belief Nets (DBNs), Recurrent Neural Networks (RNNs), among others.

As understood by those of skill in the art, machine-learning based classification techniques can vary depending on the desired implementation. For example, machine-learning classification schemes can utilize one or more of the following, alone or in combination: hidden Markov models; RNNs; CNNs; deep learning; Bayesian symbolic methods; Generative Adversarial Networks (GANs); support vector machines; image registration methods; and applicable rule-based systems. Where regression algorithms are used, they may include but are not limited to: a Stochastic Gradient Descent Regressor, a Passive Aggressive Regressor, etc.

Machine learning classification models can also be based on clustering algorithms (e.g., a Mini-batch K-means clustering algorithm), a recommendation algorithm (e.g., a Minwise Hashing algorithm, or Euclidean Locality-Sensitive Hashing (LSH) algorithm), and/or an anomaly detection algorithm, such as a local outlier factor. Additionally, machine-learning models can employ a dimensionality reduction approach, such as, one or more of: a Mini-batch Dictionary Learning algorithm, an incremental Principal Component Analysis (PCA) algorithm, a Latent Dirichlet Allocation algorithm, and/or a Mini-batch K-means algorithm, etc.

Figure 6:
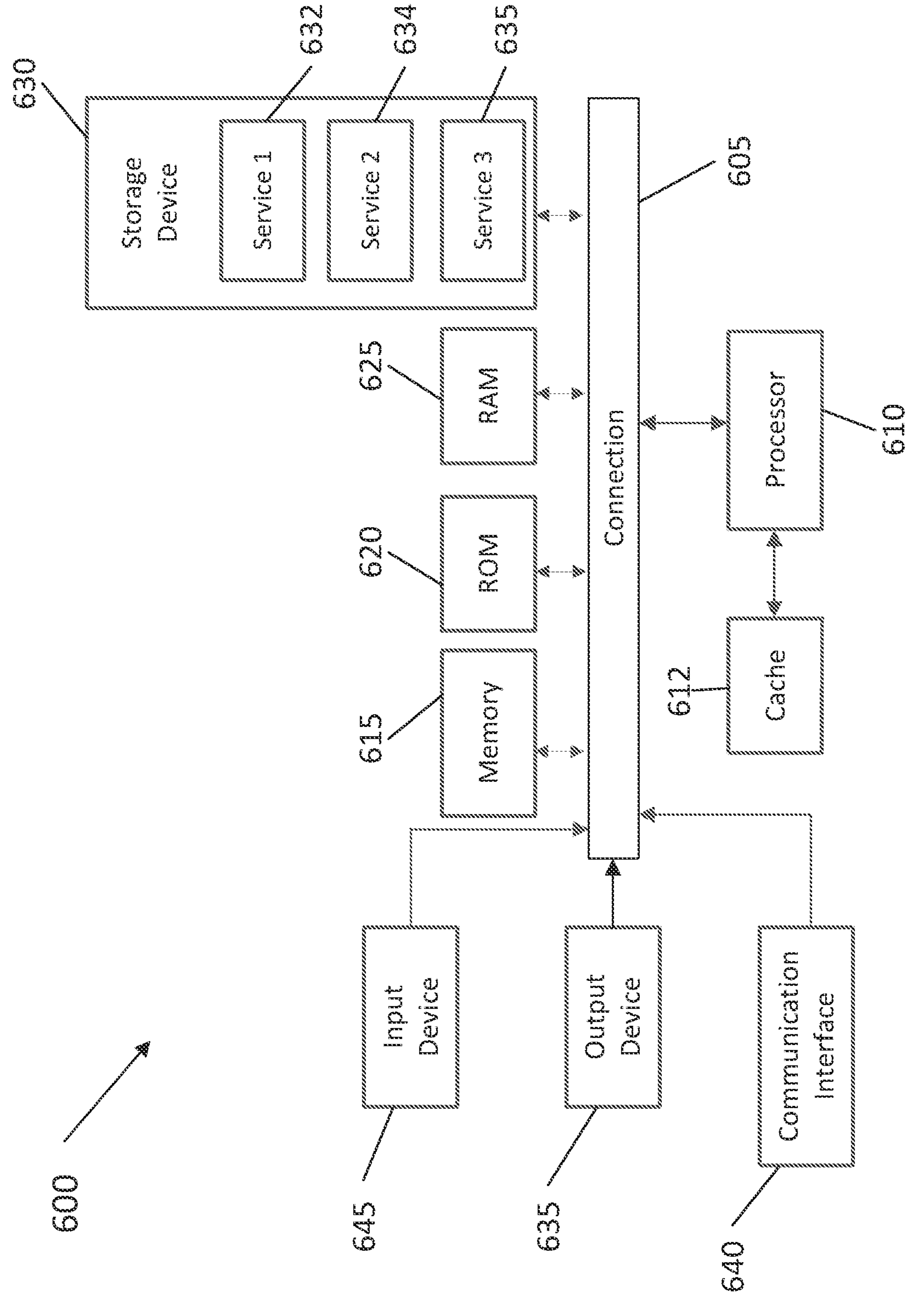
FIG. 6 illustrates an example processor-based system with which some aspects of the subject technology can be implemented.

FIG. 6 illustrates an example processor-based system with which some aspects of the subject technology can be implemented. For example, processor-based system 600 can be any computing device making up, or any component thereof in which the components of the system are in communication with each other using connection 605. Connection 605 can be a physical connection via a bus, or a direct connection into processor 610, such as in a chipset architecture. Connection 605 can also be a virtual connection, networked connection, or logical connection.

In some embodiments, computing system 600 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 600 includes at least one processing unit (Central Processing Unit (CPU) or processor) 610 and connection 605 that couples various system components including system memory 615, such as Read-Only Memory (ROM) 620 and Random-Access Memory (RAM) 625 to processor 610. Computing system 600 can include a cache of high-speed memory 612 connected directly with, in close proximity to, or integrated as part of processor 610.

Processor 610 can include any general-purpose processor and a hardware service or software service, such as services 632, 634, and 636 stored in storage device 630, configured to control processor 610 as well as a special-purpose processor where software instructions are incorporated into the actual processor design. Processor 610 may essentially be a completely self-contained computing system, containing multiple cores or processors, a bus, memory controller, cache, etc. A multi-core processor may be symmetric or asymmetric.

To enable user interaction, computing system 600 includes an input device 645, which can represent any number of input mechanisms, such as a microphone for speech, a touch-sensitive screen for gesture or graphical input, keyboard, mouse, motion input, speech, etc. Computing system 600 can also include output device 635, which can be one or more of a number of output mechanisms known to those of skill in the art. In some instances, multimodal systems can enable a user to provide multiple types of input/output to communicate with computing system 600. Computing system 600 can include communications interface 640, which can generally govern and manage the user input and system output. The communication interface may perform or facilitate receipt and/or transmission wired or wireless communications via wired and/or wireless transceivers, including those making use of an audio jack/plug, a microphone jack/plug, a Universal Serial Bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a Radio-Frequency Identification (RFID) wireless signal transfer, Near-Field Communications (NFC) wireless signal transfer, Dedicated Short Range Communication (DSRC) wireless signal transfer, 802.11 Wi-Fi® wireless signal transfer, Wireless Local Area Network (WLAN) signal transfer, Visible Light Communication (VLC) signal transfer, Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer signal transfer, ultraviolet light signal transfer, wireless signal transfer along the electromagnetic spectrum, or some combination thereof.

Communication interface 640 may also include one or more Global Navigation Satellite System (GNSS) receivers or transceivers that are used to determine a location of the computing system 600 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 630 can be a non-volatile and/or non-transitory and/or computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a Compact Disc (CD) Read Only Memory (CD-ROM) optical disc, a rewritable CD optical disc, a Digital Video Disk (DVD) optical disc, a Blu-ray Disc (BD) optical disc, a holographic optical disk, another optical medium, a Secure Digital (SD) card, a micro SD (microSD) card, a Memory Stick® card, a smartcard chip, a EMV chip, a Subscriber Identity Module (SIM) card, a mini/micro/nano/pico SIM card, another Integrated Circuit (IC) chip/card, Random-Access Memory (RAM), Atatic RAM (SRAM), Dynamic RAM (DRAM), Read-Only Memory (ROM), Programmable ROM (PROM), Erasable PROM (EPROM), Electrically Erasable PROM (EEPROM), flash EPROM (FLASHEPROM), cache memory (L1/L2/L3/L4/L5/L#), Resistive RAM (RRAM/ReRAM), Phase Change Memory (PCM), Spin Transfer Torque RAM (STT-RAM), another memory chip or cartridge, and/or a combination thereof.

Storage device 630 can include software services, servers, services, etc., that when the code that defines such software is executed by the processor 610, it causes the system 600 to perform a function. In some embodiments, a hardware service that performs a particular function can include the software component stored in a computer-readable medium in connection with the necessary hardware components, such as processor 610, connection 605, output device 635, etc., to carry out the function.

Embodiments within the scope of the present disclosure may also include tangible and/or non-transitory computer-readable storage media or devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general-purpose computer, special purpose computer, or special purpose processing device to perform a certain function or group of functions. Computer-executable instructions also include program modules that are executed by computers in standalone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network Personal Computers (PCs), minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

Illustrative examples of the disclosure include:

Aspect 1. A system comprising: at least one memory; and at least one processor coupled to the at least one memory, the at least one processor configured to: perform a test on a first hardware component type associated with an autonomous vehicle (AV) to produce a first output; perform the test on a second hardware component type associated with a simulation of an AV to produce a second output; compare the first output with the second output using a statistical analysis to determine a value related to a difference between the first output and the second output; and assign a weight to the test based on the value related to the difference between the first output and the second output.

Aspect 2. The system of Aspect 1, wherein the weight is assigned based on whether the value related to the difference between the first output and the second output is larger than a threshold value Aspect 3. The system of Aspect 1 or 2, wherein the statistical analysis is performed using machine learning.

Aspect 4. The system of any of Aspects 1 to 3, wherein the hardware component type is a graphical processing unit (GPU).

Aspect 5. The system of any of Aspects 1 to 4, wherein the weight is zero so that the test is removed from consideration.

Aspect 6. The system of any of Aspects 1 to 5, wherein the test is performed in a controlled environment to isolate the first and second hardware components.

Aspect 7. The system of any of Aspects 1 to 6, wherein the test is a nondeterministic test.

Aspect 8. A method comprising: performing a test on a first hardware component type associated with an autonomous vehicle (AV) to produce a first output; performing the test on a second hardware component type associated with a simulation of an AV to produce a second output; comparing the first output with the second output using a statistical analysis to determine a value related to a difference between the first output and the second output; and assigning a weight to the test based on the value related to the difference between the first output and the second output.

Aspect 9. The method of Aspect 8, wherein the weight is assigned based on whether the value related to the difference between the first output and the second output is larger than a threshold value.

Aspect 10. The method of Aspect 8 or 9, wherein the statistical analysis is performed using machine learning.

Aspect 11. The method of any of Aspects 8 to 10, wherein the hardware component type is a graphical processing unit (GPU).

Aspect 12. The method of any of Aspects 8 to 11, wherein the weight is zero so that the test is removed from consideration.

Aspect 13. The method of any of Aspects 8 to 12, wherein the test is performed in a controlled environment to isolate the first and second hardware components.

Aspect 14. The method of any of Aspects 8 to 13, wherein the test is a nondeterministic test.

Aspect 15. A non-transitory computer-readable storage medium comprising at least one instruction for causing a computer or processor to: perform a test on a first hardware component type associated with an autonomous vehicle (AV) to produce a first output; perform the test on a second hardware component type associated with a simulation of an AV to produce a second output; compare the first output with the second output using a statistical analysis to determine a value related to a difference between the first output and the second output; and assign a weight to the test based on the value related to the difference between the first output and the second output.

Aspect 16. The non-transitory computer-readable storage medium of Aspect 15, wherein the weight is assigned based on whether the value related to the difference between the first output and the second output is larger than a threshold value.

Aspect 17. The non-transitory computer-readable storage medium of Aspect 15 or 16, wherein the statistical analysis is performed using machine learning.

Aspect 18. The non-transitory computer-readable storage medium of any of Aspects 15 to 17, wherein the hardware component type is a graphical processing unit (GPU).

Aspect 19. The non-transitory computer-readable storage medium of any of Aspects 15 to 18, wherein the weight is zero so that the test is removed from consideration.

Aspect 20. The non-transitory computer-readable storage medium of any of Aspects 15 to 19, wherein the test is performed in a controlled environment to isolate the first and second hardware components.

The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure.

Claim language or other language in the disclosure reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

What is claimed is:

1. A system comprising:
at least one memory; and
at least one processor coupled to the at least one memory, the at least one processor configured to:
perform a test on a first hardware component type associated with an autonomous vehicle (AV) to produce a first output;
perform the test on a second hardware component type associated with a simulation of an AV to produce a second output;
compare the first output with the second output using a statistical analysis to determine a value related to a difference between the first output and the second output; and
assign a weight to the test based on the value related to the difference between the first output and the second output.

2. The system of claim 1, wherein the weight is assigned based on whether the value related to the difference between the first output and the second output is larger than a threshold value.

3. The system of claim 1, wherein the statistical analysis is performed using machine learning.

4. The system of claim 1, wherein the hardware component type is a graphical processing unit (GPU).

5. The system of claim 1, wherein the weight is zero so that the test is removed from consideration.

6. The system of claim 1, wherein the test is performed in a controlled environment to isolate the first and second hardware components.

7. The system of claim 1, wherein the test is a nondeterministic test.

8. A method comprising:
performing a test on a first hardware component type associated with an autonomous vehicle (AV) to produce a first output;
performing the test on a second hardware component type associated with a simulation of an AV to produce a second output;
comparing the first output with the second output using a statistical analysis to determine a value related to a difference between the first output and the second output; and
assigning a weight to the test based on the value related to the difference between the first output and the second output.

9. The method of claim 8, wherein the weight is assigned based on whether the value related to the difference between the first output and the second output is larger than a threshold value.

10. The method of claim 8, wherein the statistical analysis is performed using machine learning.

11. The method of claim 8, wherein the hardware component type is a graphical processing unit (GPU).

12. The method of claim 8, wherein the weight is zero so that the test is removed from consideration.

13. The method of claim 8, wherein the test is performed in a controlled environment to isolate the first and second hardware components.

14. The method of claim 8, wherein the test is a nondeterministic test.

15. A non-transitory computer-readable storage medium comprising at least one instruction for causing a computer or processor to:

perform a test on a first hardware component type associated with an autonomous vehicle (AV) to produce a first output;

perform the test on a second hardware component type associated with a simulation of an AV to produce a second output;

compare the first output with the second output using a statistical analysis to determine a value related to a difference between the first output and the second output; and assign a weight to the test based on the value related to the difference between the first output and the second output.

16. The non-transitory computer-readable storage medium of claim 15, wherein the weight is assigned based on whether the value related to the difference between the first output and the second output is larger than a threshold value.

17. The non-transitory computer-readable storage medium of claim 15, wherein the statistical analysis is performed using machine learning.

18. The non-transitory computer-readable storage medium of claim 15, wherein the hardware component type is a graphical processing unit (GPU).

19. The non-transitory computer-readable storage medium of claim 15, wherein the weight is zero so that the test is removed from consideration.

20. The non-transitory computer-readable storage medium of claim 15, wherein the test is performed in a controlled environment to isolate the first and second hardware components.

* * * * *